US006963122B1

(12) United States Patent
Soenen et al.

(10) Patent No.: US 6,963,122 B1
(45) Date of Patent: Nov. 8, 2005

(54) CAPACITOR STRUCTURE AND AUTOMATED DESIGN FLOW FOR INCORPORATING SAME

(75) Inventors: Eric Soenen, Danville, CA (US); Dan Bui, Sunnyvale, CA (US)

(73) Assignee: Barcelona Design, Inc., Sunnyvale, CA (US)

( * ) Notice: Subject to any disclaimer, the term of this patent is extended or adjusted under 35 U.S.C. 154(b) by 0 days.

(21) Appl. No.: 10/656,793

(22) Filed: Sep. 5, 2003

Related U.S. Application Data
(60) Provisional application No. 60/449,329, filed on Feb. 21, 2003.

(51) Int. Cl.$^7$ .............................................. H01L 29/00
(52) U.S. Cl. ..................................................... 257/532
(58) Field of Search ................................ 257/296, 298, 257/300, 301, 303, 308, 528, 532; 716/8, 9, 10, 11

(56) References Cited

U.S. PATENT DOCUMENTS

| | | | |
|---|---|---|---|
| 4,409,608 A | | 10/1982 | Yoder |
| 5,208,725 A | | 5/1993 | Akcasu |
| 5,753,949 A | * | 5/1998 | Honma et al. |
| 5,939,766 A | | 8/1999 | Stomeijer et al. |
| 6,385,033 B1 | | 5/2002 | Javanifard et al. |
| 6,523,159 B2 | | 2/2003 | Bernstein et al. |
| 6,737,698 B1 | * | 5/2004 | Paul et al. |
| 6,743,671 B2 | * | 6/2004 | Hu et al. |

OTHER PUBLICATIONS

Aparicio, R., Hajimiri, A., "Capacity Limits and Matching Properties of Integratted Capacitors", pp. 384–393, IEEE Journal of Solid–State Circuits, vol. 37, No., Mar. 2002.

Samavati, H., Hajimiri, A., Shahani, A., Nasserbakht, G., T. "Fractal Capacitor", pp. 256–257, ISSCC 1998.

* cited by examiner

*Primary Examiner*—Nathan J. Flynn
*Assistant Examiner*—Kevin Quinto
(74) *Attorney, Agent, or Firm*—Blakely, Sokoloff, Taylor & Zafman, LLP

(57) ABSTRACT

A capacitive structure is described that comprises a first node and a second node. The first node comprises a first pair of vertically aligned strips that are electrically connected with one or more vias and a second pair of vertically aligned strips that are electrically connected with one or more vias. The higher strips of both of the pairs are at a same metal level and the lower strips of both of the pairs are at a same lower metal level. The second node comprises, at the metal level, a first metal structure having a pair of windows. A first of the windows surround and are isolated from a first of the higher strips. A second of the windows surround and are isolated from a second of the higher strips. The second node also comprises, at the lower metal level, a second metal structure having a pair of windows. A first of the windows surround and are isolated from a first of the lower strips. A second of the windows surround and are isolated from a second of the lower strips. The first and second metal structures are electrically connected with one or more vias.

26 Claims, 8 Drawing Sheets

CAPACITOR STRUCTURE AND AUTOMATED DESIGN FLOW FOR INCORPORATING SAME

CLAIM OF PRIORITY

The present application hereby claims priority to and the benefit of the filing date of U.S. Provisional Application 60/449,329 filed on Feb. 21, 2003.

STATEMENT OF U.S. GOVERNMENT RIGHTS AND DEPARTMENT OF DEFENSE EFFORTS

The United States Government has a paid-up license in portions of this invention as provided for by the terms of Agreement No. F33615-01-2-1979, awarded by the United States Air Force Research Laboratory.

BACKGROUND

Capacitance is the amount of charge drawn upon a pair of conductors separated by dielectric material for a voltage applied across the pair of conductors. FIG. 1 shows a classic parallel plate capacitor. The classic parallel plate capacitor includes a first conducting plate 101 that is parallel with a second conducting plate 102. The pair of conducting plates 101, 102 are separated by dielectric material (which is not specially depicted for convenience in the drawing of FIG. 1). Each plate 101, 102 may be viewed as a separate node of the capacitor. The capacitance, C, for a classic parallel plate capacitor may be expressed as $$C=(\epsilon A)/d \qquad \text{EQN. 1}$$

where: 1) $\epsilon$ is the permitivity of the dielectric material; 2) A is the cross sectional area of the conducting plates 101, 102 (as measured along the xy plane): and, 3) d is the distance between the conducting plates 101, 102 (as measured along the z axis).

If a voltage is applied across the conducting plates 101, 102 electric flux lines are established between the plates (substantially along the z axis in the depiction of FIG. 1). The density or amount of flux lines is proportional to the charge drawn on the plates. Hence large permitivity $\epsilon$ and large plate area A each correspond to large capacitance. Note also that the closer the parallel plates are spaced apart (i.e., the smaller d becomes), the larger the capacitance. Thus, capacitance is strongly related to the geometry of the capacitor's design as represented by the terms A and d in EQN. 1, above.

Semiconductor manufacturing processes are capable of forming conductors of various shapes and sizes separated by dielectric; and, therefore, are likewise capable of forming a multitude of different types of capacitive structures (e.g., beyond the simple parallel plate capacitor of FIG. 1). However, some types of capacitive structures may be more suitable for certain types of electrical circuits. For example, in the case of certain types of Analog-to-Digital Converter (ADC) circuits, arrays of identically designed capacitors are used. The more that a plurality of capacitors can be designed and manufactured to have the same capacitance (a characteristic referred to as "matching"), the higher the bit resolution that may be targeted for an ADC circuit that uses them (which, in turn corresponds to a more precise analog-to-digital conversion).

FIGURES

The present invention is illustrated by way of example and not limitation in the figures of the accompanying drawings, in which like references indicates similar elements and in which.

DETAILED DESCRIPTION

Figure 1:
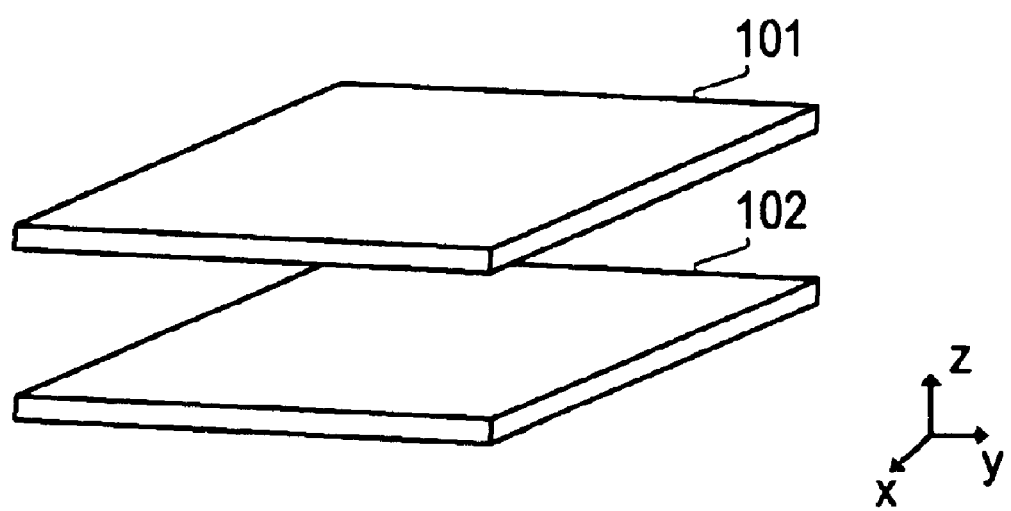
FIG. 1 shows an embodiment of a parallel plate capacitor.
Figure 2A:
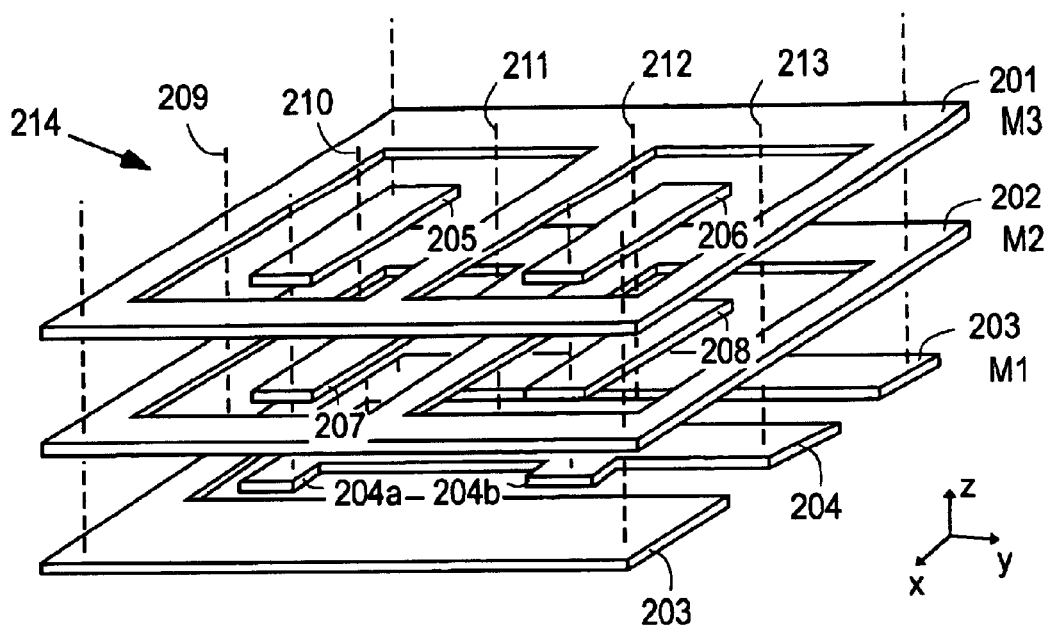
FIGS. 2a through 2f show different possible perspectives of an improved capacitive structure approach that exhibits good matching characteristics.
Figure 2B:
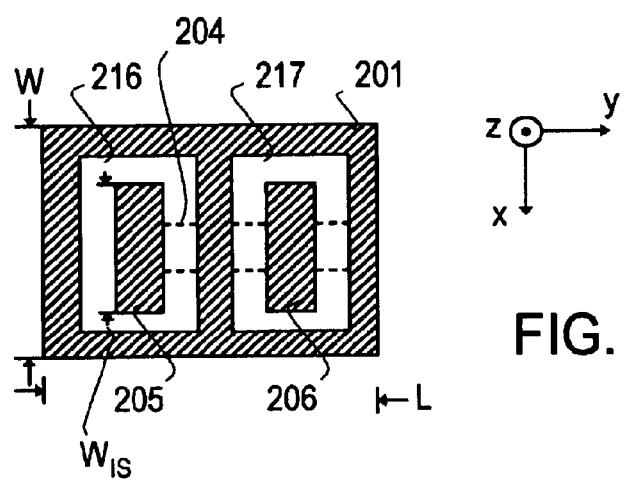
Figure 2C:
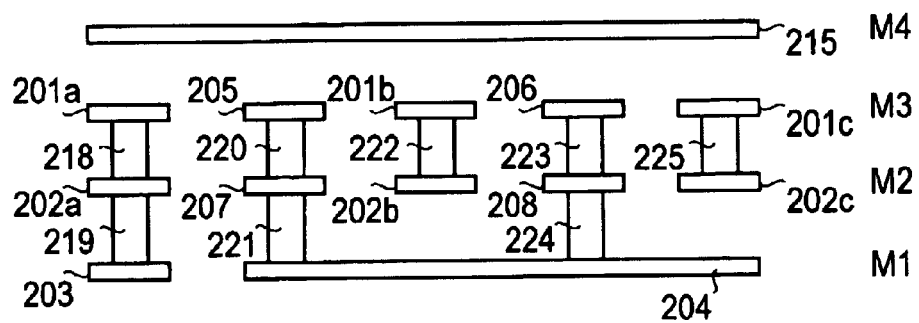

A depiction of a novel capacitor that yields good matching characteristics is presented in FIGS. 2a through 2c. Semiconductor manufacturing processes are naturally inclined to create conducting strips in the metal layers residing above the semiconductor surface. For example, the wire structures formed at the metal layers of a semiconductor device may be viewed more generically as individual strips. Here, because semiconductor manufacturing processes place high emphasis on tightly controlling the dimensions of the strips that are formed in the metal levels (e.g., in order to enhance reliability and/or yield of the semiconductor device), forming a capacitive structure with such strips should yield good matching characteristics.

Moreover, beyond matching aspects, the capacitive structure of FIGS. 2a through 2c should also yield a high capacitance because of concentric walls that are formed around openings in metal that reside at a particular layer. The concentric metal walls around an opening result in electric flux lines spanning in directions all around an isolated strip (such as strip 205) that resides within the opening. The openings can be viewed as being made to form naturally by electrical connection of both lengthwise and widthwise strips along a metal level. For example, considering the x axis of FIGS. 2a through 2c as the axis for the "width" dimension; and, considering the y axis of FIGS. 2a through 2c as the axis for the "length" dimension, note that structure 201 can be viewed as a pair of lengthwise strips and a trio of widthwise strips that are electrically connected to one another at all points of intersection. By so connecting, a pair of windows or openings 216, 217 are observed in metal structure 201 (see, FIG. 2b).

Structure 201, being an electrically connected surrounding structure of strips, is to be viewed as part of a first node of the capacitor. Widthwise strips 205 and 206, by contrast, are to be viewed as part of a second node of the capacitor. Here, the terms "outer" and "inner" will be used to refer to the concentric, surrounding metal (e,g, metal 201) and the widthwise strips (e.g., widthwise strips 205, 206), respectively. Note that inner strips 205, 206 are both: 1) electrically isolated from the outer node 201; and, 2) are located within respective openings 216, 217 of the surrounding outer structure 201 (i.e., inner strip 205 is located in opening 216 and inner strip 206 is located in opening 217).

Outer surrounding structure 201 and inner strips 205, 206 are electrically connected to a lower, similarly structured metal layer. The lower metal layer includes another outer surrounding structure 202 (again, formed with lengthwise and widthwise strips connected at points of intersection so as to form concentric walls around openings) and inner strips 207, 208 that are isolated from the outer structure 202 and are placed in the openings of outer structure 202.

With respect to the lower layer, outer surrounding structure 202 is part of the same "outer" capacitor node that surrounding structure 201 of the higher layer is part of; and, inner trips 207, 208 are part of the same "inner" capacitor node that inner strips 205, 206 of the higher layer are part of. In order to effect proper electrical connection, vertical alignment is established amongst the outer structures and inner strips of different metal layers. That is, the widthwise strips of outer structure 201 are vertically aligned with widthwise strips of outer structure 202 (e.g., the rightmost widthwise strip of outer structure 201 is vertically aligned with the rightmost widthwise strip of outer structure 202; the middle widthwise strip of outer structure 201 is vertically aligned with the middle widthwise strip of outer structure 202; the leftmost widthwise strip of structure 201 is vertically aligned with the leftmost widthwise strip of structure 202); and, the inner strips 205, 206 of the higher metal layer are vertically aligned with the inner strips 207, 208 of the lower metal layer (e.g., strip 205 is vertically aligned with strip 207; and, strip 206 is vertically aligned with strip 208).

Here, note that the axis lines observed in FIG. 2a (e.g., axis lines 209 through 213 amongst others) help to illustrate the vertical alignment. Vertical alignment means enough overlap exists to form an electrical connection. In the case of semiconductor implementations it is expected that vias will be used to form the electrical connections between vertically aligned features that are designed to be part of a same capacitor node. FIG. 2c demonstrates this aspect in more detail.

FIG. 2c shows a cross section of the capacitive structure of FIG. 2a along reference line 214. Here, via 218 connects leftmost widthwise strip 201a of outer structure 201a to the leftmost widthwise strip 202a of outer structure 202; via 219 connects the leftmost widthwise strip 202a of outer structure 202 to "horseshoe" shaped outer node bus 203. The outer bus 203 is used to support contacts that are part of the capacitor's outer node. Via 220 connects inner strip 205 to inner strip 207. Via 221 connects inner strip 207 to the inner capacitive node bus 204. The inner capacitive node bus 204 is used to support contacts that are part of the capacitor's inner node.

Likewise, vias 222 and 225 respectively connect the middle 201b, 202b and rightmost 201c, 202c widthwise strips of outer structures 201 and 202; and, via 223 connects inner strip 206 to inner strip 208. Because the inner capacitive node bus 204 runs along reference line 214, FIG. 2c shows the full run length of the inner node bus 204 along the bottom layer. Here, referring to FIG. 2a, vias can be distributed around the outer bus 203 to make additional connections to outer structure 202; and, vias can be distributed along the tongue extensions (e.g., tongue extensions 203a, 203b) of the inner bus 204 to make additional connections to inner strips 207, 208.

Note that the basic capacitive structure observed in FIGS. 2a through 2c can be fitted to various desired dimensions. For example, the width may be expanded or contracted along the x axis (so that the lengthwise strips are proportionately longer or shorter as compared to the particular aspect ratio depicted in FIGS. 2a and 2b). Likewise the pattern may be replicated so as to form more than two openings along a single lengthwise axis. For example, the lengthwise strips of structures 201 and 202 could be run for further distances so as to include more than three widthwise strips (and therefore more than two openings).

In the vertical dimension (i.e., along the z axis of FIGS. 2a–c), the basic structure may be replicated upward through multiple layers of metal. For example, in order to form a four layer structure, another two layer structure could be vertically aligned with the two layer structure of FIGS. 2a–c where inner nodes are connected as between the two structures, and where, outer nodes are connected as between the two structures. Likewise, an eight layer structure could be formed by stacking and interconnecting a pair of four layer structures as described above. Structures having an odd number of layers can also be readily built.

Moreover, again in semiconductor applications, strips are spaced in accordance with the manufacturing layout/design rules of the underlying manufacturing process. For example, most semiconductor manufacturing processes refer to a minimum allowable line spacing. Here, referring to FIG. 2c, an aggressive capacitive structure design that attempts to achieve a high capacitive density would place: the leftmost strip 201a of structure 201 at the minimum allowable line spacing from strip 205, strip 205 at the minimum allowable line spacing from middle strip 201b of structure 201, etc.; where, the spacing is measured along the y axis.

FIG. 2c also shows that a shielding layer 215 can optionally be featured above the capacitor. Here, a feature of the capacitor is that the inner node lends itself to being well shielded from fields that are external to the capacitor. That is, the outer structures 201, 202 and their corresponding vias together form modestly porous concentric surrounding conducting walls around the inner strips 205 through 208 that laterally protect the inner strips from external fields (note, the porosity can be reduced by tightly packing the inner node's vias (e.g., at the maximum density the semiconductor process allows).

Vertical protection from external fields can be applied by shield 215 and bus 203. According to an alternative approach, shielding for the inner node is provided by effectively "moving" bus 204 up to the M2 layer (where structures 202, 207 and 208 are drawn as residing) or even the M3 layer (where structures 202, 205, 206 are drawn as residing). From FIG. 2a it is apparent that bus 204 can be easily moved up to the M2 level by replacing inner strips 207, 208 with bus 204 and by cutting openings into outer structure 202 along axis 214 (wide enough to give room for bus 204) at both the middle and rightmost segments 202b, 202c (referring to FIG. 2c).

Figure 3:
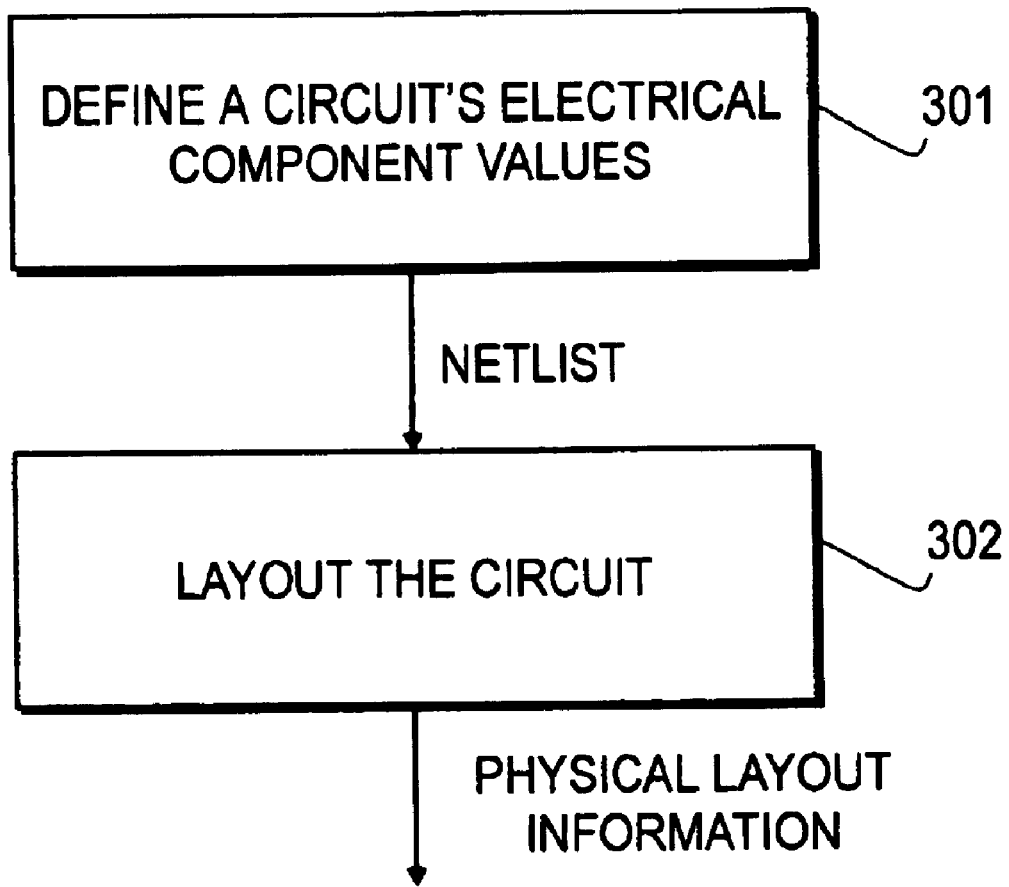
FIG. 3 shows a design flow for an automated design tool.

Automated design tools are used to efficiently design an electrical circuit. FIG. 3 shows an embodiment of a basic methodology that may be used to design a circuit with automated assistance such as computer aided design (CAD). According to the methodology of FIG. 3, an electrical circuit's component values are first defined 301; then, the circuit is layed out 302. The definition of the circuit's component values may include a description of each component (e.g., each transistor, resistor, capacitor, etc.). For example, a body of information often referred to as a netlist: 1) lists each node in a circuit; 2) for each listed node: a list of each component connected to the node; and 3) a description of each component (e.g., a transistor component might be described as being NMOS or PMOS and might be further described by its gate length).

Figure 4:
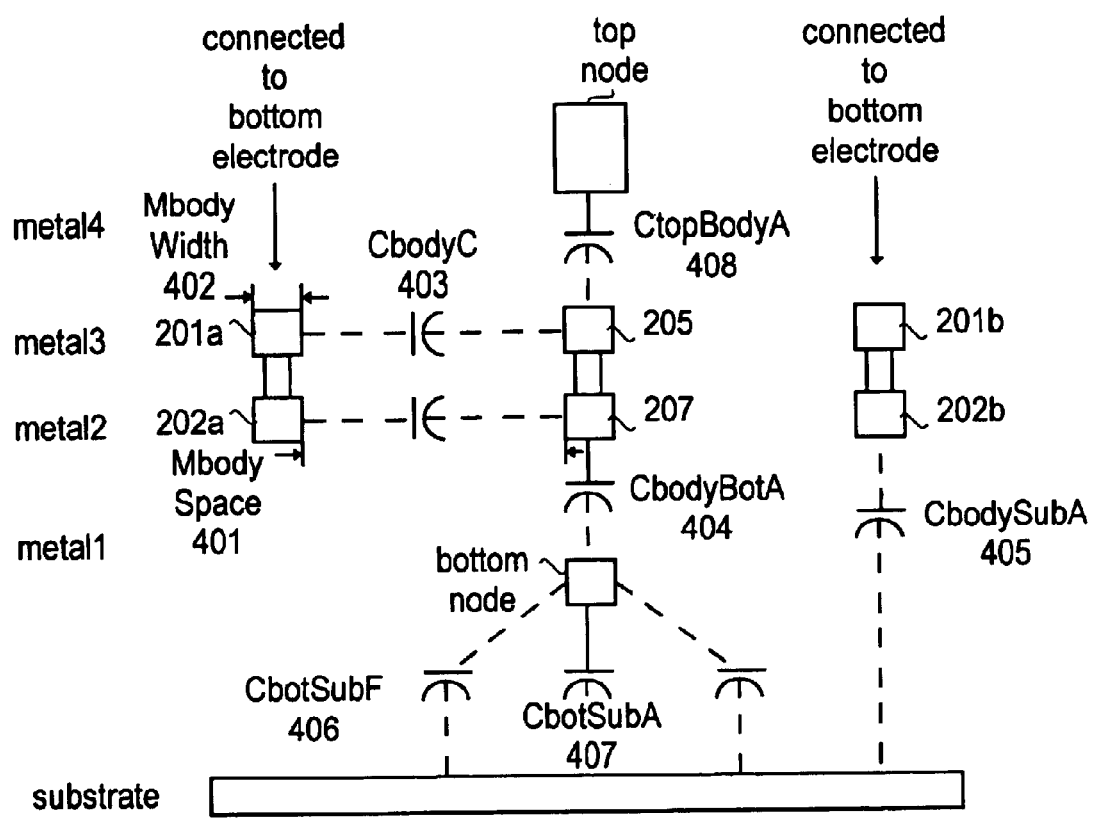
FIG. 4 shows a model for a capacitor described herein.

The netlist is then used as a based for simulation (e.g., PSPICE, HSPICE, etc.) so that the performance of the circuit can be analyzed. If the circuit meets its functional requirements, the circuit is layed out 302. If the circuit does not meet its functional requirements the circuit design is changed in an attempt to cure the functional defect(s); which, in turn, corresponds to a new definition of component values 301 (e.g., a new netlist). The individual component descriptions of the circuit (which are expected to be compatible for the simulation technique (e.g., PSPICE models, HSPICE models, etc.)) are often based on models of the components themselves. FIG. 4 shows a model that can be used for netlist/simulation purposes for a slightly modified version of the capacitor discussed in FIGS. 2a through 2c.

Figure 2D:
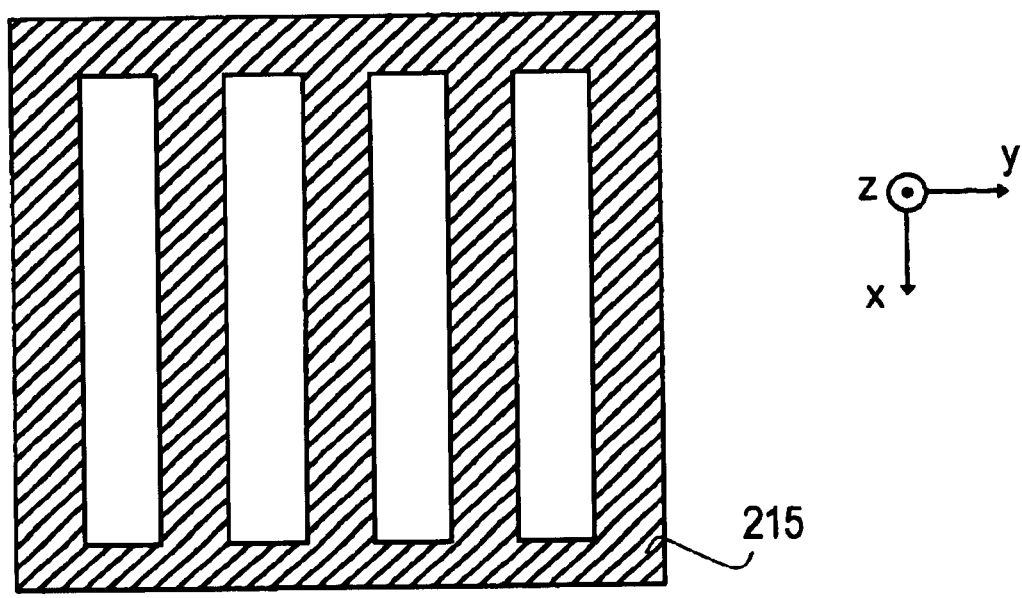
Figure 2E:
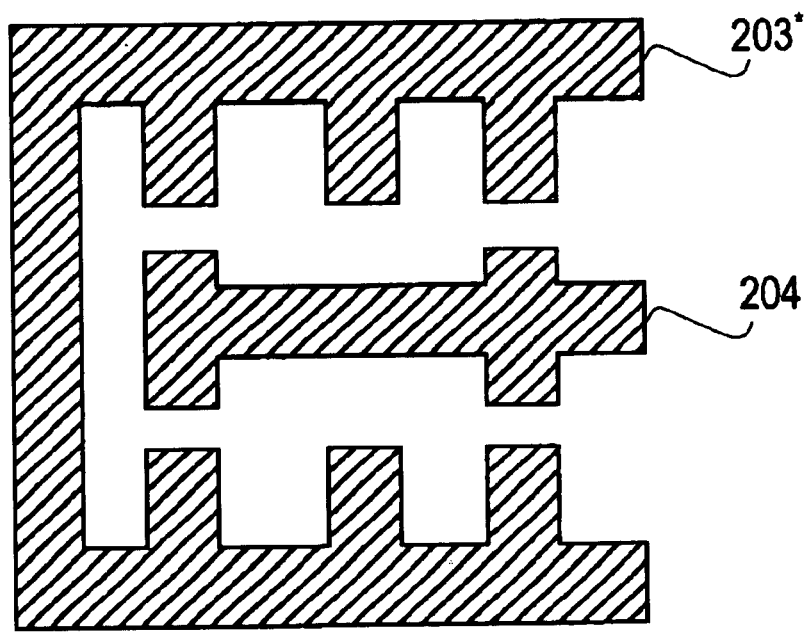

Referring back to FIGS. 2a and 2c, the modification takes the form of having a first plate 215 located above the structure that is connected to outer structures 201, 202 (hereinafter, "first outer node plate"); and, having a second plate 203* located below the structure that is connected to the same outer surrounding structures 201, 202 (hereinafter, "second outer node plate"). FIG. 2d shows a top-down view of the first outer node plate 215. Note that the first outer node plate 215 can be viewed as a series of parallel shield strips. FIG. 2e shows a top-down view of the second outer node plate 203*. The second outer node plate 203* can be viewed as a series of parallel shield strips that are cut into in order to make room for bus 204.

Note that outer node plate 203* is slightly different than structure 203 of FIG. 2a. However, structure 203 could be easily converted precisely into outer node plate 203* simply by extending the width of capacitor of FIG. 2a along the x axis. Moreover, note that a structure identical to the first outer node plate 215 of FIG. 2d could be used to implement the second outer node plate if bus 204 is moved to M2 or M3 as discussed previously.

The first outer node plate 215 shields inner strips 205, 206 and helps form part of the overall outer node (that is formed with structures 215, 201, 202, 203) that surrounds the inner node metal 205, 206, 207, 206. Likewise the second outer node plate 203* shields inner strips 207, 208 and helps form part of the outer node. With the description provided just above, a clear picture can be envisioned of inner metallurgy 205 through 208 corresponding to an inner capacitive node surrounded by concentric walls formed by metallurgy 215, 201, 202, 203 that correspond to an outer capacitive node. Referring to FIG. 2c, what was previously referred to as shield 215 can now be viewed as the first outer node plate 215. Note that vias can be added that connect the first outer node plate 215 to structure 201.

Figure 2F:
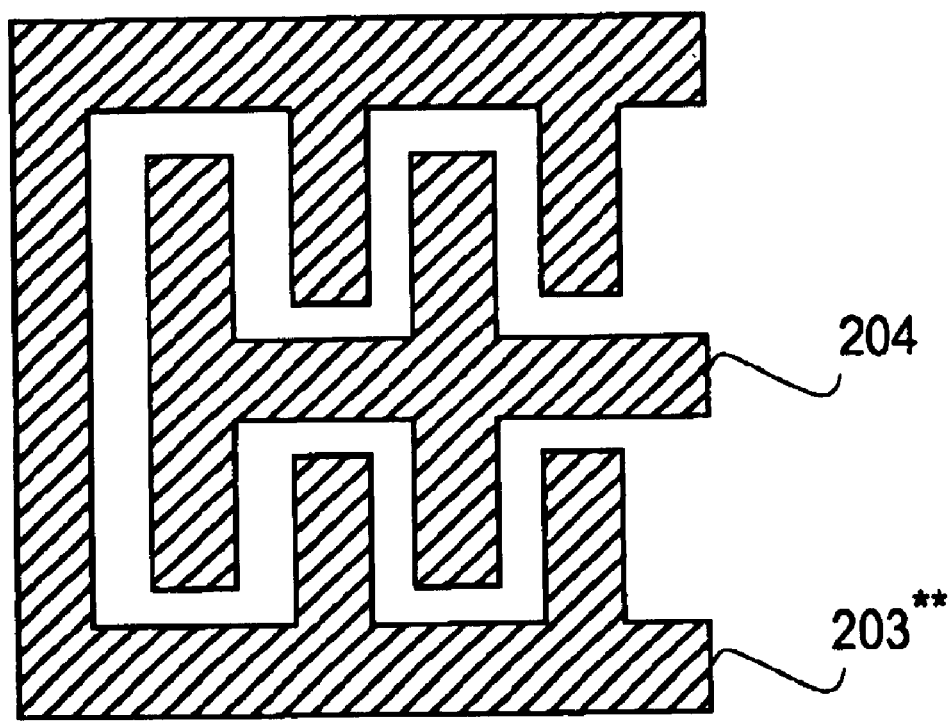

Before moving on to FIG. 4, and stepping aside from discussions regarding automated design, note that a many different design variants exist. For example, to name just a few: 1) the capacitive structure in FIG. 2a can be reduced from a 3 layer structure to a 2 layer structure simply by removing features 201, 205, 206 and any vias that connect to them; 2) a single layer, "practically two dimensional", concentric capacitor can be formed at only a single level of metal (e.g., the depictions of nodes 203, 204 in FIG. 2a as well as nodes 203*, 203 of FIG. 2e correspond to examples of single layer concentric wall capacitors; FIG. 2f shows even another embodiment having features 203**, 204). Also, FIGS. 2a through 2f show an approach having two inner strips per metal layer Other embodiments may choose to embrace only a single inner strip per metal layer or more than two inner strips per metal layer. Also, if manufacturing rules allow, vias can be replaced with solid lines to create substantially non porous walls around the inner node.

FIG. 4 shows a model suitable for forming simulation models of a capacitor taking the simpler form described just above. Note that only the most fundamental segment of the capacitor is shown (i.e., only the relationships surrounding a pair of vertically aligned inner strips 205, 207 surrounded by corresponding outer structures 201a,b and 202a,b. More advanced structures can be easily modeled by replicating the model observed in FIG. 4 as appropriate.

Referring to the model of FIG. 4, the following model components should be available from the manufacturer or readily calculated from data supplied by the manufacturer: 1) MbodySpace 401 (the spacing of metal lines from one another); 2) MbodyWidth 402 (the width of each body metal lines); 3) CbodyC 403 (the coupling capacitance per unit length between two body metal lines in parallel next to each another); 4) CbodyBotA 404 (the plate capacitance per unit length between the lowest body metal layer and the second inner node plate); 5) CbodySubA 405 (the plate capacitance per unit length between the lowest body metal layer and the semiconductor substrate); 6) CbotSubF 406 (the side fringing capacitance per unit length between the second inner node plate and the semiconductor substrate); 7) CbotSubA 407 (the plate capacitance per unit length between the second inner node plate and the semiconductor substrate); 8) CtopBodyA 408 (the plate capacitance per unit length between the first outer node plate and the highest body metal).

With the parameters outlined above, the following design equations apply:

$$C_{total} = 2N_{bl}N_{IS}W_{IS}CbodyC + 2N_{IS}W_{IS}CtopBodyA + 2N_{IS}W_{IS}CbodyBotA \quad 1)$$

$$L = 2N_{IS}(MbodyWidth + MbodySpace) + MbodyWidth \quad 2)$$

$$W = W_{IS} + 2(MbodyWidth + 4MbodySpace) \quad 3)$$

$$CbotSub = (N_{IS}+1)W(CbotSubA + 2CbotSubF) + N_{IS}W(CbodySubA) \quad 4)$$

$$CtopSub = L(CbotSubA) + 2CbotSubF \quad 5)$$

where:
a) $C_{total}$ is the total capacitance of the capacitor between the upper and outer node plates;
b) L is the total length of the capacitor in the Y direction (see, FIG. 2b)
c) W is the total width of the capacitor in the X direction (see, FIG. 2b)
d) CbotSub is the total parasitic capacitance between the outer node plate and the semiconductor substrate
e) CtopSub is the total parasitic capacitance between the inner node plate and the semiconductor substrate and where:
i) $N_{bl}$ is the total number of body layers (i.e., layers having inner strips surrounded by a metal structure)
ii) $W_{IS}$ is the inner strip length (see, FIG. 2b)
iii) $N_{IS}$ is the total number of inner strips per body layer (e.g., $N_{IS}=2$ in FIG. 2b).

From these, models for design simulation as well as specific capacitor geometries can be calculated.

Note that the relationships provided above approximate the observed behavior that: 1) the capacitance contributed by the vias is negligible; 2) the capacitance contributed by perpendicular junctions (i.e., "crotches") of metal (e.g., as observed in each of surrounding structures 201 and 202 of FIG. 2) is negligible by laying out the crotches away from the inner strip using 4 MbodySpace as indicated in Eqn. 3; and, 3) the contributions of the inner node plate to body metal (CtopBodyF) and body metal to outer node plate (CbodyBotF) side fringing capacitances are approximated to be the same as the plate capacitance (CtopBodyA, CbodyBotA). If the later assumption is disregarded, a more accurate total capacitance equation can be expressed as:

$$C_{total} = 2N_{bl}N_{IS}W_{IS}CbodyC + N_{IS}W_{IS}(CtopBodyA + CtopBodyF) + N_{IS}W_{IS}(CbodyBotA + CbodyBotF) \quad 6)$$

Figure 5:
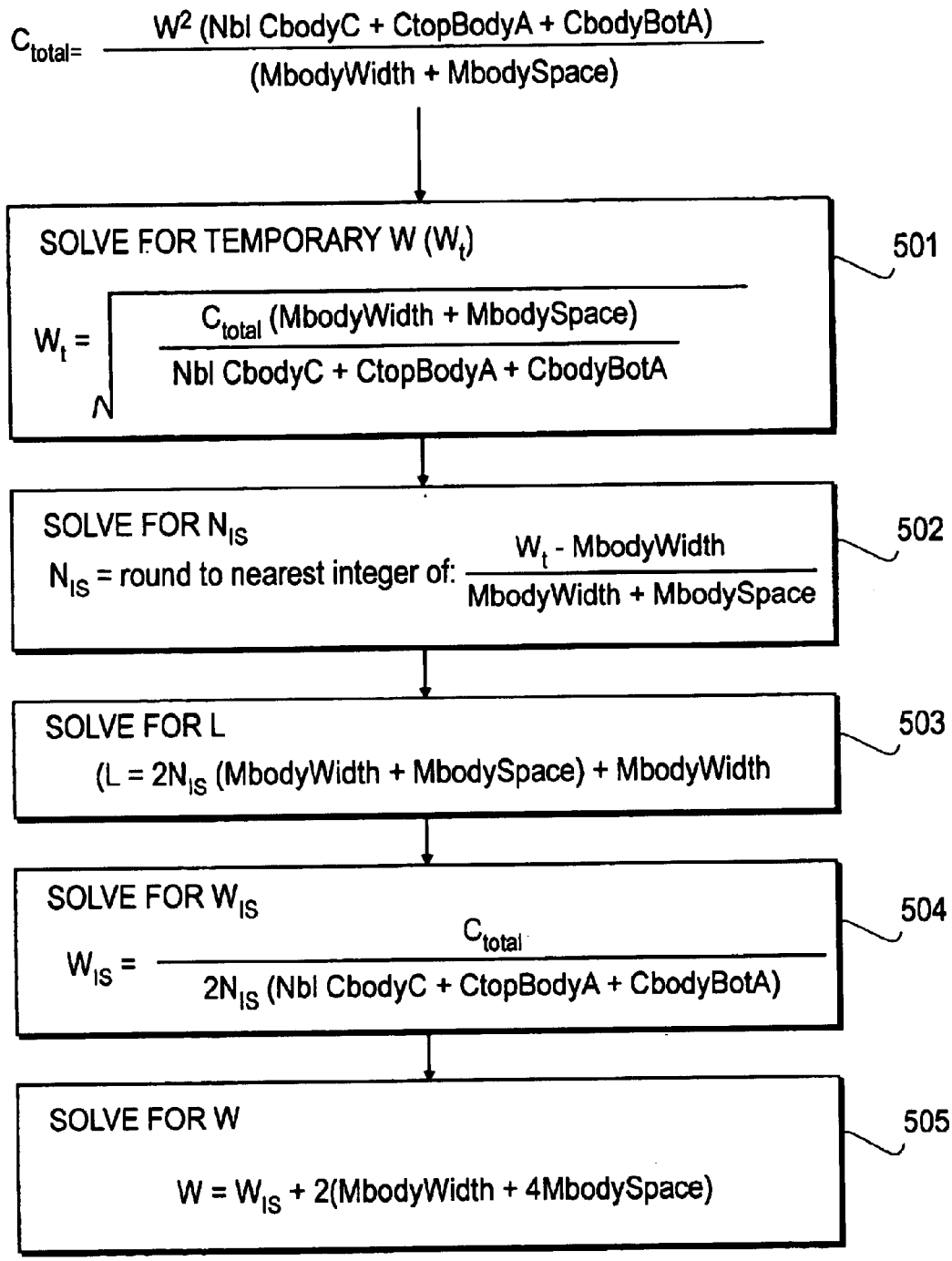
FIG. 5 shows a methodology for determining the geometry of different capacitor features.

The equations outlined above can be used to formulate software code for an automated design tool that is responsible for solving for the appropriate geometries of the capacitor in response to a specific desired capacitance. FIG. 5 shows an embodiment of a methodology that receives as an input the desired capacitance ($C_{total}$) for the capacitor to be designed, the number of body layers to be used in constructing the capacitor ($N_{bl}$) and the various process parameters outlined above for the targeted manufacturing process (e.g., MbodySpace, MbodyWidth, etc.). In response, the methodology provides the W, L, $N_{IS}$ and $W_{IS}$ values that will produce a capacitor having the desired $C_{total}$.

The particular methodology of FIG. 5 is aimed at producing a capacitor having a 1:1 aspect ratio (i.e., a top down view of the capacitor will reveal a square or near-square having L approximately equal to W). The $C_{total}$ equation observed in FIG. 5 is used as a basis for the methodology as is derived from equations 1 through 3 above with some approximations. Specifically, note that equation 1 can be re-written as:

$$C_{total}=2N_{IS}W_{IS}(N_{bl}CbodyC+CtopBodyA+CbodyBotA) \quad 7)$$

and that equation 2 can be approximated as:

$$L=2N_{IS}(MbodyWidth+MbodySpace) \quad 8)$$

For a square aspect ratio:

$$W=L \quad 9)$$

Also the approximation:

$$W_{IS} \approx W \quad 10)$$

can be made. Equations 8) and 9) can each be readily solved for $N_{IS}$ as:

$$N_{IS}=L/(2(MbodyWidth+MbodySpace)) \quad 11)$$

$$N_{IS}=W/(2(MbodyWidth+MbodySpace)) \quad 12)$$

Factoring Eqn. 1) and substituting Eqn. 10) into Eqn. 1) yields:

$$C_{total}=2N_{IS}W(N_{bl}CbodyC+CtopBodyA+CbodyBotA) \quad 13)$$

Further substituting Eqn. 12) into Eqn. 13) yields:

$$C_{total}=2W(W/(2(MbodyWidth+MbodySpace)))(N_{bl}CbodyC+Ctop\text{-}BodyA+CbodyBotA) \quad 14)$$

Which can be rearranged as the equation for $C_{total}$ observed in FIG. 5.

With the starting point of the equation for $C_{total}$ observed in FIG. 5, a temporary value for the capacitor width $W_t$ is first calculated 501. The calculation of $W_t$ acts as the mathematical equivalent of "placing a stake in the ground" and is a basis value from which final geometries are calculated. The equation for $W_t$ is simply the formula for $C_{total}$ observed in FIG. 5 rearranged and solved for W. Note that each of the parameters are either a designer input value ($C_{total}$, $N_{bl}$) or a process parameter (MbodyWidth, MbodySpace, etc.). Once $W_t$ is calculated 501 it is used as a basis for calculating $N_{IS}$ 502. The equation for $N_{IS}$ is simply equation 2 above rearranged for $N_{IS}$ and where L has been set equal $W_t$ (which is consistent with the "square" design objective). The closest integer is rounded to because a pair of openings are created in the basic surrounding structure which results in inner strips being created in pairs.

Once $N_{IS}$ has been calculated 502, L is calculated 503 directly from equation 2 without modification. Once $N_{IS}$ is calculated 503, $W_{IS}$ is calculated 504. The depicted equation for $W_{IS}$ is derived from a rearrangement of equation 7. Finally, once $W_{IS}$ is calculated 504, the width of the capacitor W is calculated 505 directly from equation 3. It is important to emphasize that other suitable methodologies for calculating a capacitor's geometries can be determined by those of ordinary skill in light of the equations presented above or in light of equations that are more accurate (or less accurate) than those recited above.

Figure 6:
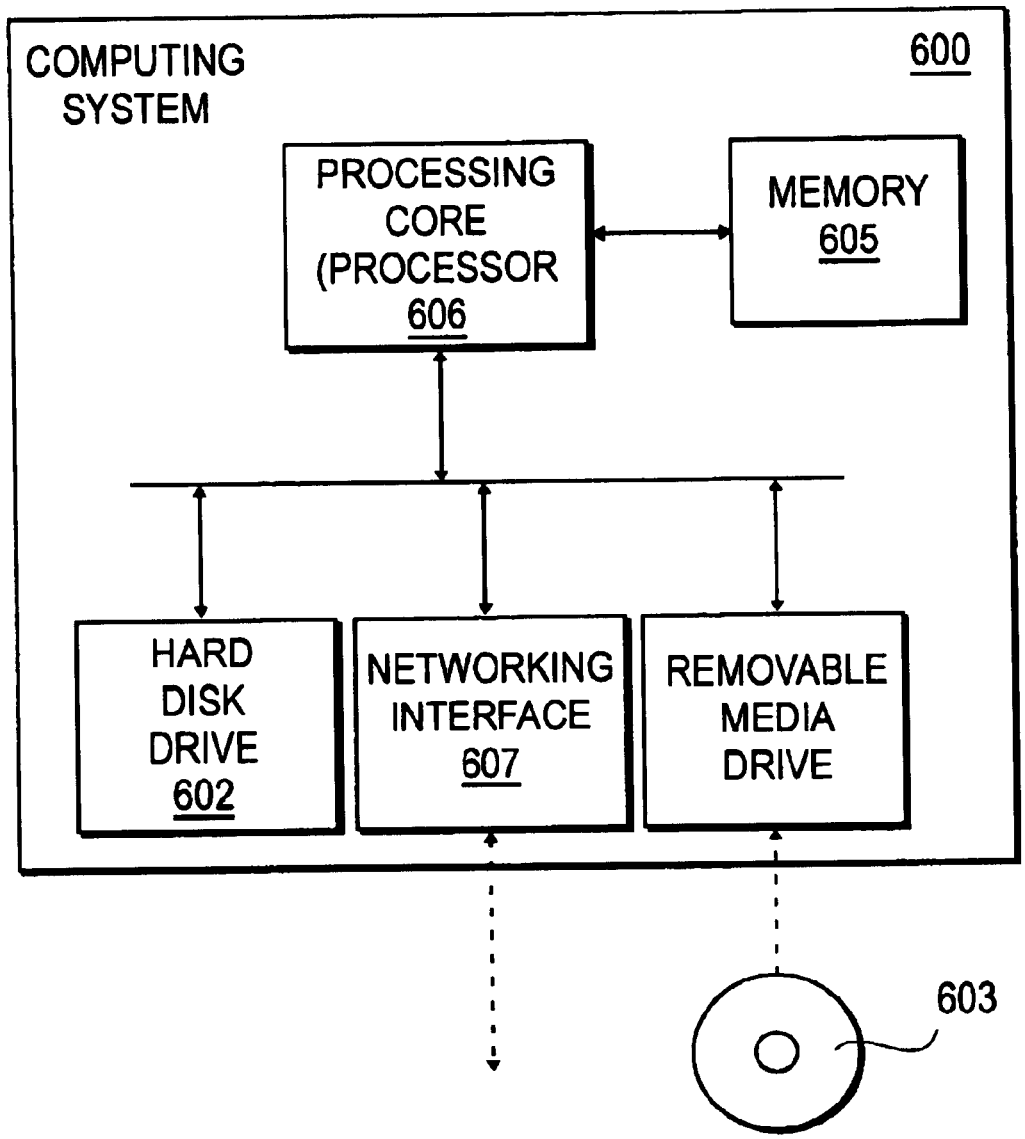
FIG. 6 shows an embodiment of a computing system.

FIG. 6 shows an embodiment of a computing system 600 that can execute instructions residing on a machine readable medium (noting that other (e.g., more elaborate) computing system embodiments are possible). In one embodiment, the machine readable medium may be a fixed medium such as a hard disk drive 602. In other embodiments, the machine readable medium may be movable such as a CD ROM 603, a compact disc, a magnetic tape, etc. The instructions (or portions thereof) that are stored on the machine readable medium are loaded into memory (e.g., a Random Access Memory (RAM)) 605; and, the processing core 606 (e.g. having one or more processors) then executes the instructions. The instructions may also be received through a network interface 607 prior to their being loaded into memory 605.

Note also that design embodiments of the present description may be implemented not only within a semiconductor chip but also within machine readable media. For example, the designs discussed above may be stored upon and/or embedded within machine readable media associated with a design tool used for designing semiconductor devices. Examples include a circuit description formatted in the VHSIC Hardware Description Language (VHDL) language, Verilog language or SPICE language. Some circuit description examples include: a behaviorial level description, a register transfer level (RTL) description, a gate level netlist and a transistor level netlist. Machine readable media may also include media having layout information such as a GDS-11 file.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A semiconductor chip, comprising:
   a capacitive structure, comprising:
      a) an inner node, comprising:
         a first pair of vertically aligned strips electrically connected with one or more vias, a second pair of vertically aligned strips electrically connected with one or more vias, the higher strips of both of said pairs at a same metal level, the lower strips of both of said pairs at a same lower metal level;
b) an outer node, comprising:
at said metal level:
a first metal structure having a pair of windows, a first of said windows surrounding and isolated from a first of said higher strips, a second of said windows surrounding and isolated from a second of said higher strips;
at said lower metal level:
a second metal structure having a pair of windows, a first of said windows surrounding and isolated from a first of said lower strips, a second of said windows surrounding and isolated from a second of said lower strips;
said first and second metal structures electrically connected with one or more vias;
c) a third metal structure at another metal level other than said metal level and other than said lower metal level, said third metal structure at least partially vertically aligned with at least one of said pairs of vertically aligned strips, said third metal structure electrically connected to said inner node; and,
d) a fourth metal structure at said another metal level, said fourth metal structure substantially surrounding said third metal structure on three sides of said third metal structure within the plane of said another metal level to shield said third metal structure, said fourth metal structure electrically connected to said outer node, said fourth metal structure not completely surrounding said third metal structure within the plane of said another metal level.

2. The semiconductor chip of claim 1 wherein said lower metal level is a second metal level of said semiconductor device and said higher metal level is a third metal level of said semiconductor device.

3. The semiconductor chip of claim 1 wherein said another metal level is beneath said lower strips and said second metal structure.

4. The semiconductor chip of claim 1 wherein said fourth metal structure comprises shielding strips.

5. The apparatus of claim 1 wherein said capacitive structure is part of an Analog-to-Digital Converter (ADC) circuit.

6. The semiconductor chip of claim 1 further comprising a first plane of metal that is at least partially vertically aligned with and above said higher strips and said first metal structure.

7. The semiconductor chip of claim 6 wherein said first plane of metal comprises shielding strips and is electrically connected to said outer node.

8. A semiconductor chip, comprising:
a capacitive structure comprising, at a same metal level, an outer metal structure that forms a window that surrounds and is isolated from an inner, metal strip within the plane of said metal level, said capacitive structure also comprising, at another metal level, another metal structure that substantially surrounds but does not completely surround an inner metal structure, said another metal structure electrically coupled to said outer metal structure with one or more vias, said inner metal structure electrically coupled to said inner metal strip with one or more vias.

9. The semiconductor chip of claim 8 wherein said outer metal feature further comprises a second window that surrounds and is isolated from a second, inner metal strip.

10. The apparatus of claim 8 wherein said capacitive structure is part of an ADC circuit.

11. The semiconductor chip of claim 8 further comprising, at a second another metal level and in a location that is vertically aligned with said outer metal structure, a second outer metal structure that is connected to said outer metal structure with one or more vias.

12. The semiconductor chip of claim 9 further comprising, at said second another metal level and in a location that is vertically aligned with said metal strip, another metal strip that is connected to said metal strip with one or more vias and is isolated from said second outer metal structure, said another metal strip within a window formed by said second outer metal structure.

13. A machine readable medium having stored thereon instructions which when executed by a computing system cause said computing system to perform a method, said method comprising:
designing a capacitive structure into a design for an electronic circuit, said capacitive structure comprising:
a) a first node, comprising:
a first pair of vertically aligned strips electrically connected with one or more vias, a second pair of vertically aligned strips electrically connected with one or more vias, the higher strips of both of said pairs at a same metal level, the lower strips of both of said pairs at a same lower metal level;
b) a second node, comprising:
at said metal level:
a first metal structure having a pair of windows, a first of said windows surrounding and isolated from a first of said higher strips, a second of said windows surrounding and isolated from a second of said higher strips;
at said lower metal level:
a second metal structure having a pair of windows, a first of said windows surrounding and isolated from a first of said lower strips, a second of said windows surrounding and isolated from a second of said lower strips;
said first and second metal structures electrically connected with one or more vias;
c) a third metal structure at another metal level other than said metal level and other than said lower metal level, said third metal structure at least partially vertically aligned with at least one of said pairs of vertically aligned strips, said third metal structure electrically connected to said inner node; and,
d) a fourth metal structure at said another metal level, said fourth metal structure substantially surrounding said third metal structure on three sides of said third metal structure within the plane of said another metal level to shield said third metal structure, said fourth metal structure electrically connected to said outer node, said fourth metal structure not completely surrounding said third metal structure within the plane of said another metal level.

14. The machine readable medium of claim 13 wherein said designing further comprises calculating a width for said capacitive structure.

15. The machine readable medium of claim 13 wherein said designing further comprises calculating a length for said capacitive structure.

16. The machine readable medium of claim 13 wherein said designing further comprises calculating a number of strips of which said vertically aligned strips are included.

17. The machine readable medium of claim 13 wherein said designing further comprises using an equation that includes the capacitance of said capacitive structure.

18. The machine readable medium of claim 13 wherein said designing further comprises using an equation that includes the spacing between metal lines.

19. The machine readable medium of claim 13 wherein said designing further comprises using an equation that includes the width of a metal line.

20. A machine readable medium having stored thereon instructions which when executed by a computing system cause said computing system to perform a method, said method comprising:

designing a capacitive structure into a design for an electronic circuit, said designing comprising:

designing at a same metal level, an outer metal structure that forms a window that surrounds and is isolated from an inner, metal strip within the plane of said metal level;

designing at another metal level, another metal structure that substantially surrounds but does not completely surround an inner metal structure; and, designing said another metal structure to be electrically coupled to said outer metal structure with one or more vias, and designing said inner metal structure to be electrically coupled to said inner metal strip with one or more vias.

21. The machine readable medium of claim 20 wherein said designing further comprises calculating a width for said capacitive structure.

22. The machine readable medium of claim 20 wherein said designing further comprises calculating a length for said capacitive structure.

23. The machine readable medium of claim 20 wherein said designing further comprises calculating a number of strips of which said vertically aligned strips are included.

24. The machine readable medium of claim 20 wherein said designing further comprises using an equation that includes the capacitance of said capacitive structure.

25. The machine readable medium of claim 20 wherein said designing further comprises using an equation that includes the spacing between metal lines.

26. The machine readable medium of claim 20 wherein said designing further comprises using an equation that includes the width of a metal line.

\* \* \* \* \*